United States Patent [19]

Sakamoto

[11] 3,824,474

[45] July 16, 1974

[54] AUTOMATIC FREQUENCY CONTROL DEVICE

[75] Inventor: Yoichi Sakamoto, Osaka, Japan

[73] Assignee: Matsushita Electric Industrial Co., Ltd., Osaka-fu, Japan

[22] Filed: Sept. 21, 1972

[21] Appl. No.: 290,841

[30] Foreign Application Priority Data

Sept. 25, 1971 Japan .............................. 46-74878
Sept. 25, 1971 Japan .............................. 46-74879

[52] U.S. Cl. .................... 325/420, 325/464, 334/15
[51] Int. Cl. ............................................ H04b 1/16
[58] Field of Search ........... 325/418, 419, 420, 422, 325/423, 461, 464, 465, 468, 432; 334/14, 15, 16; 331/10, 34

[56] References Cited

UNITED STATES PATENTS

| | | | |
|---|---|---|---|
| 3,619,803 | 11/1971 | Klein | 325/423 X |
| 3,693,094 | 9/1972 | Kanamara et al. | 325/461 |
| 3,697,885 | 10/1972 | Arins et al. | 325/422 X |

*Primary Examiner*—Benedict V. Safourek

[57] ABSTRACT

An automatic frequency control device for a television receiver is provided in which a DC tuning voltage superposed upon AFC voltage is applied to one end of a varactor in an UHF tuner whereas said DC tuning voltage is applied to one end of a varactor in a VHF tuner and AFC voltage with a polarity opposite to that of the first mentioned AFC voltage is applied to the other end of the varactor.

5 Claims, 10 Drawing Figures

AUTOMATIC FREQUENCY CONTROL DEVICE

BACKGROUND OF THE INVENTION

The present invention relates to an automatic frequency control device (to be referred to as "the AFC device" in this specification) for a television tuner of the type using variable capacitor diodes (to be referred to as the "varactors" in this specification) as tuning elements.

In the electronic tuner in which the varactors are used as tuning elements, the feedback factor, that is a ratio of the variation in local oscillation frequency to AFC output voltage (MHz/V) is considerably higher than that of the conventional turret tuner or variable capacitor tuner, so that the difference between the hold-in and pull-in ranges of the oscillator frequency becomes large, especially in the UHF tuner. As a result there is a problem that a voltage to be applied to a varactor cannot be set.

In the conventional AFC devices, the voltage which is obtained from the AFC generator and is applied to the varactor is varied depending upon the UHF and VHF bands through switching means. Therefore, the special switches must be provided and there arises a problem that the voltage applied to the varactor in one of the UHF and VHF tuners becomes too small.

These problems may be overcome by making the difference between the hold-in and pull-in ranges smaller.

SUMMARY OF THE INVENTION

Briefly stated, according to the present invention, a DC tuning voltage is superposed upon AFC voltage and is applied to one end of a varactor in a UHF tuner whereas the DC tuning voltage is applied to one end of a varactor in a VHF tuner and the AFC voltage with the polarity opposite to that of AFC voltage applied to the UHF tuner is applied to the other end of the varactor.

One of the objects of the present invention is to make the difference between the hold-in and pull-in ranges smaller.

Another object of the present invention is to make the hold-in and pull-in ranges of the UHF tuner as small as possible.

Another object of the present invention is to provide an improved AFC device simple in construction yet highly reliable and dependable in operation.

The above and other objects, features and advantages of the present invention will become more apparent from the following description of the preferred embodiments thereof taken in conjunction with the accompanying drawings.

DESCRIPTION OF THE PREFERRED EMBODIMENTS:

Prior Art, FIGS. 1—4

Prior to the description of the preferred embodiments of the present invention, the prior art automatic frequency control circuit will be described briefly in order to distinctively point out the problems thereof which the present invention contemplates to overcome.

Figure 1:
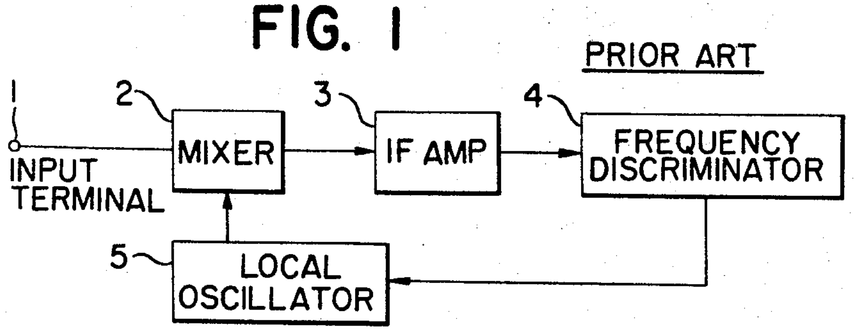
FIG. 1 is a block diagram of a prior art AFC circuit.

The prior art AFC shown in FIG. 1 in block diagram generally comprises an input terminal 1, a mixer 2, an IF amplifier 3, 4 a frequency discriminator 4, and a local oscillator 5.

Figure 2A:
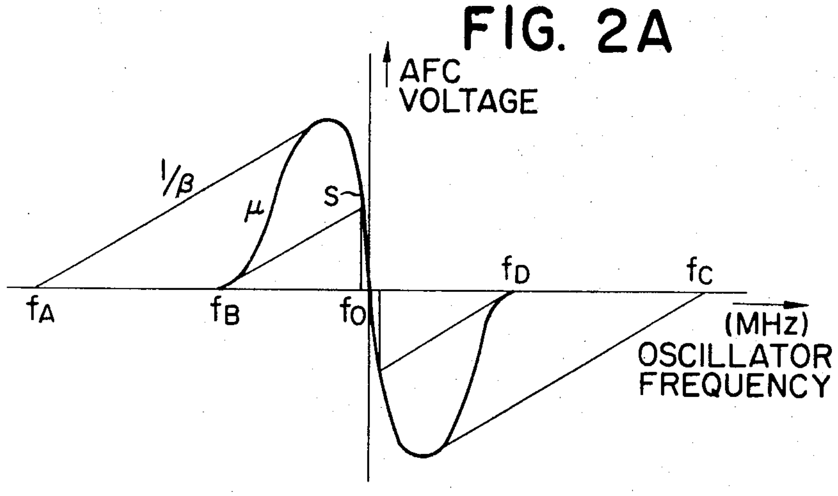
FIG. 2A is a view illustrating the relation between the local oscillation frequency and the AFC voltage.

Referring to FIG. 2A illustrating the relation between the AFC voltage and the local oscillation frequency, $\mu$ denotes a transfer constant (V/MHz) of the frequency discriminator, and $\beta$, a feedback factor (MHz/V) of variation in local oscillation frequency with respect to the output of the frequency discriminator. Therefore the slope of the S-curve is $\mu$ while the slope of the straight curve is $1/\beta\beta$.

Figure 2B:
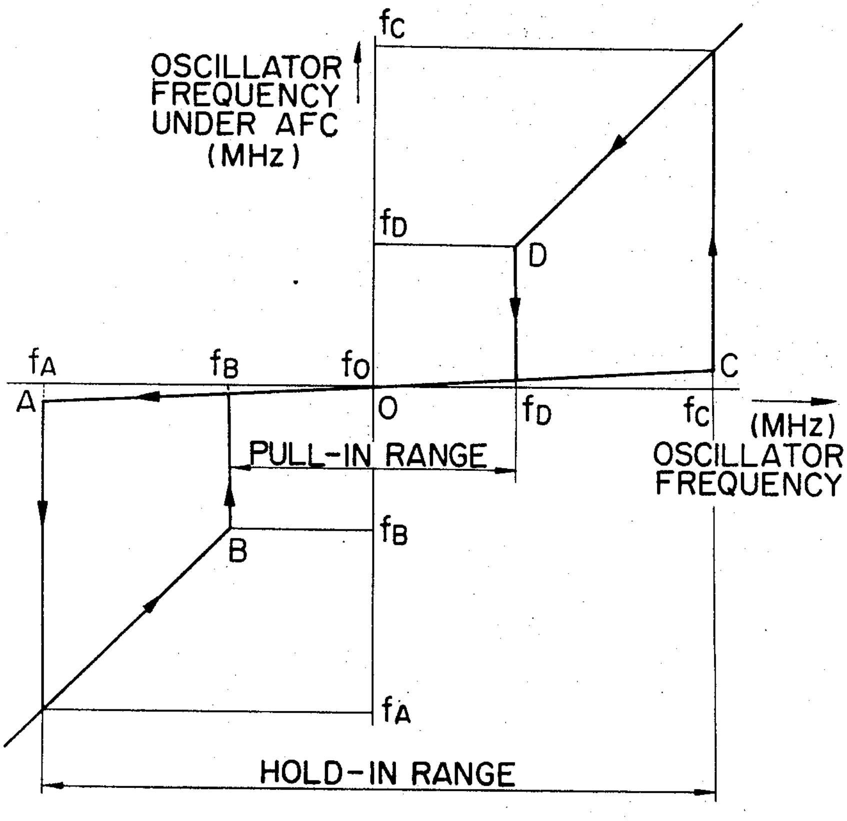
FIG. 2B is a view used for the explanation of the mode of operation of the prior art AFC device shown in FIG. 1.

Referring to FIG. 2B, the mode of operation of the prior art AFC of the type described with reference to FIGS. 1 and 2A will be described. When a voltage applied across a varactor is so changed as to decrease the local oscillation frequency from a point higher than $f_0$ toward the point D, the local oscillation frequency is pulled in to a range closer to $f_0$ by the AFC. As the voltage impressed across the varactor is changed in the same direction, the local oscillation frequency is not keyed by the AFC any longer and becomes $f_A$. When the voltage impressed across the varactor is changed in the opposite direction, the local oscillation frequency is pulled in to a range close to $f_0$ at the point B, but AFC is lost at the point C. The range between $f_B$ and $f_D$ is referred to as the pull-in range whereas the range between $f_A$ and $f_C$, is the hold-in range.

Figure 3A:
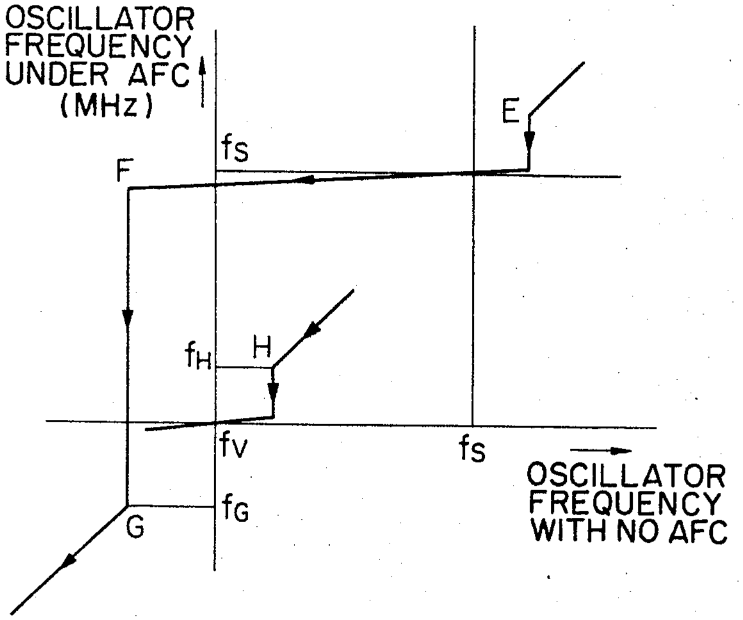
FIG. 3A and FIG. 3B are views used for the explanation of the adverse effects when the difference between the hold-in and pull-in ranges is wide.
Figure 3B:
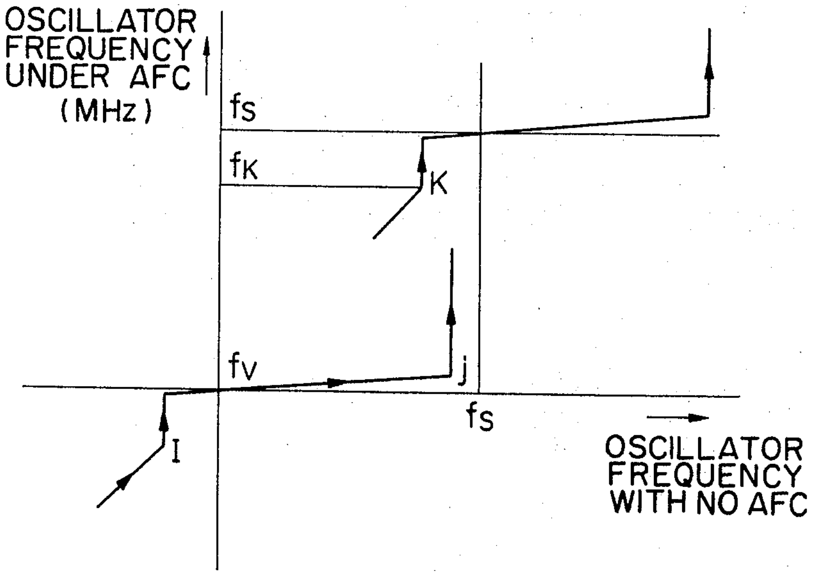

FIGS. 3A and 3B are views used for the explanation of the adverse effects encountered when the difference between the pull-in and hold-in ranges is too wide. $f_V$ = video carrier frequency + video IF whereas $f_S$ = audio carrier frequency + video IF. When the voltage impressed across the varactor is so decreased that the oscillator frequency is decreased from a point higher than $f_S$ to a lower frequency, the oscillator frequency is pulled into $f_S$ at the point E as shown in FIG. 3A. When the hold-in range extends as far as the point F and is wider than ($f_S$ + $f_V$ + pull-in range), the oscillator frequency is not pulled in to $f_V$ but jumps or skips to $f_G$. This means that the voltage applied across the varactor cannot be set. In practice the local oscillation frequency should have been pulled in to $f_V$ at the point H.

When the voltage applied across the varactor is so increased as shown in FIG. 3B, the oscillator frequency is pulled in to $f_V$ at the point I. If the hold-in range is wider than ($f_S$ - $f_V$) and if the voltage applied across the varactor is set to the point in the proximity of the hold-in range J and is added to the varactor when channels are changed, the oscillator frequency is pulled in to $f_K$ from $f_S$.

To overcome the above described adverse effects, the difference between the hold-in and pull-in ranges must be minimized. However, the feedback factor $\beta$ of the electronic tuner in which a varactor is used as a tuning element is considerably higher than that of the conventional AFC in the turret tuner or a variable capacitor tuner. As a result, the difference between the pull-in and hold-in ranges becomes wider as shown in FIG. 2. This is especially pronounced in case of a UHF tuner.

Figure 4:
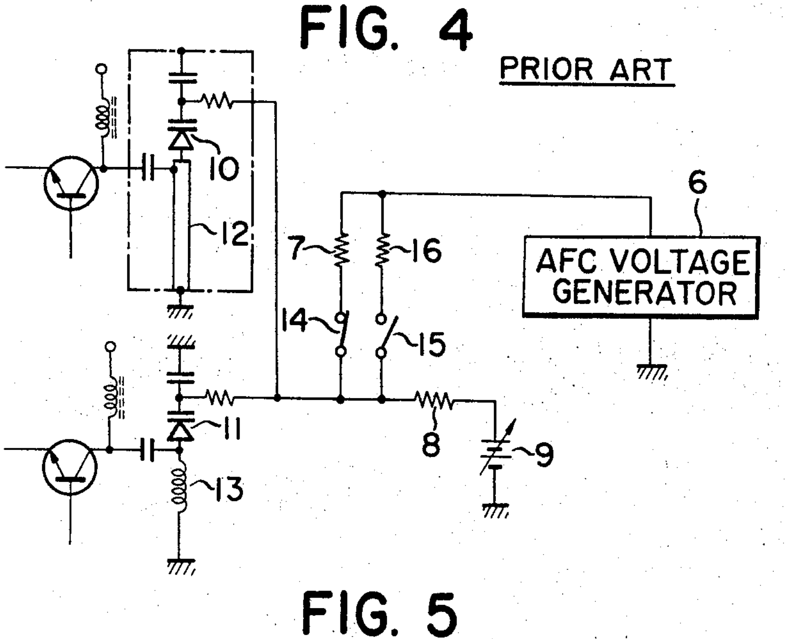
FIG. 4 is a circuit diagram of the AFC circuit shown in block diagram in FIG. 1.

Referring to FIG. 4, the output voltage from an AFC voltage generator 6 is divided by resistors 7 and 8 and superposed upon the output voltage from a voltage source 9 for channel selection to be applied to varactors 10 and 11 to which are coupled a resonant line 12 of a UHF tank circuit and a resonant coil 13 of a VHF tank circuit, respectively. When the switch 14 is closed whereas the switch 15 is opened, the UHF channel may be received, but when the switch 14 is opened whereas the switch 15 is closed the VHF channel may be received and the AFC voltage is divided by the resistor 8 and 16. If the resistor 7 is greater in magnitude than the resistor 16, it is possible to make the feedback factor $\beta$ in case of the UHF channel reception the same with that is case of the VHF channel reception, but the circuit shown in FIG. 4 requires two switches 14 and 15 and has the problem that the resistor 16 is too small to apply sufficient voltages to the varactor diodes.

The Invention, FIGS. 5, 6, 7, and 8

Figure 5:
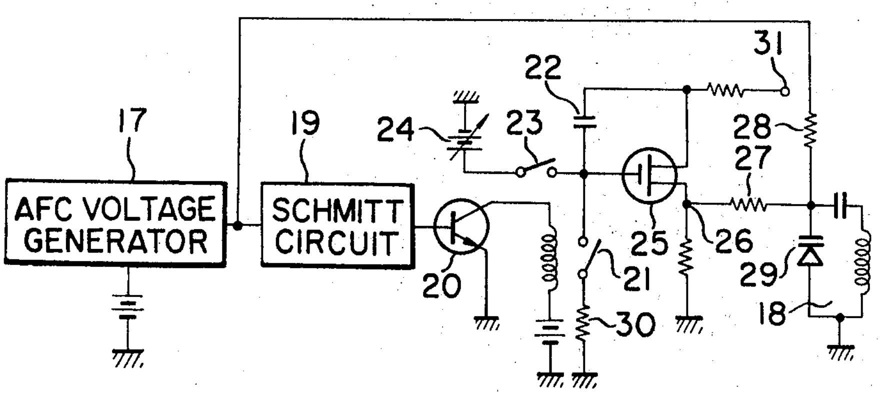
FIG. 5 is a circuit diagram of an AFC circuit to which is applied the present invention.

First referring to FIG. 5 a circuit, which is not an embodiment of the present invention but to which is advantageously applied the principle of the present invention, will be described. The circuit shown in FIG. 5 comprises an AFC voltage generator 17, a local oscillator tank circuit 18, a Schmitt circuit 19, a switching transistor 20 which is actuated in response to the output signal of the Schmitt circuit 19, a switch 21 which is actuated in response to the switching action of the transistor 20, a charging capacitor 22, a switch 23 which is closed when the capacitor 22 is charged with the voltage supplied from a voltage source 24, a MOS transistor 25 for deriving the voltage across the capacitor 22 from the junction 26, resistors 27 and 28 for superimposing the voltage at the junction 26 on the AFC voltage; a varactor 29; a resistor 28 for discharging slowly the capacitor 22, and a power source terminal 31.

Figure 6:
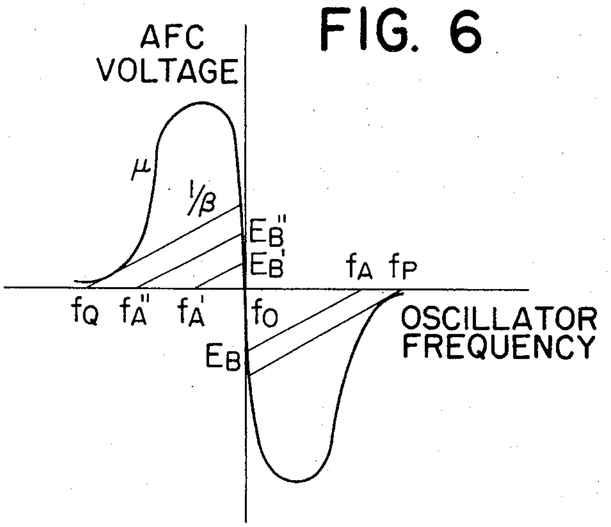
FIG. 6 is a view used for the explanation of the mode of operation thereof.

Next referring to FIG. 6, $f_0$ is a correct receiver frequency; $f_A$ and $f_A''$ are frequencies within the pull-in range between $f_P$ and $f_Q$; and $f_A'$ which is the oscillator frequency when there is no AFC action is selected between $f_A$ and $f_A''$. The voltage required for abtaining $f_A'$ is derived from the source terminal or junction 26 of the MOS transistor 25 by closing the switch 23 so as to cause the power source 24 to charge the capacitor 22. The voltage of the power source 24 is maintained at a constant level by suitable means. For example, there may be provided two local oscillators which oscillate so as to sweep the frequency in response to the sweep voltage and which are so arranged that when one oscillator starts sweeping the other stops sweeping. The frequency width between the sweep starting and ending frequencies is made equal to the channel width, and the alternate frequency sweepings by the two local oscillators are started from the carrier frequency of the lowest TV channel. The number of alternate frequency sweepings is counted, and in response to the detection of a desired number of frequency sweepings, the frequency sweeping by one local oscillator is stopped so that the sweep voltage at which the frequency sweeping is stopped is used to set the voltage of the power source 24.

The capacitor 22 is gradually discharged so that the voltage at the terminal 26 is gradually increased, As a result $f_A'$ in FIG. 6 is slowly displaced to the right so that $E_B'$ is gradually decreased to the point $E_B$ at which the Schmitt circuit 19 is triggered. As a result the switching transistor 20 is actuated to close the switch 21 so that the capacitor 22 starts to discharge through the resistor 30. The voltage across the capacitor 22 is gradually lowered so that $f_A'$ decreases gradually from the point $f_A$.

In general the action of the Schmitt circuit has hysteresis so that once $f_A'$ is set between $f_A$ and $f_A''$, $f_A'$ oscillates between $f_A$ and $f_A''$. Therefore the reception can be continued semi-permanently by the circuit shown in FIG. 5. However, the difference between $f_A$ and $f_A''$ must be so selected as to locate $f_A'$ between them as shown in FIG. 6, but when the AFC voltage is equal in UHF and VHF reception as shown in FIG. 5, the difference between $f_A$ and $f_A''$ in VHF reception becomes extremely narrow. This problem may be overcome by making equal the feedback factors both in UHF and VHF channel receptions. The present invention is based upon the observed fact and will become more apparent from the following description of the preferred embodiments thereof.

Figure 7:
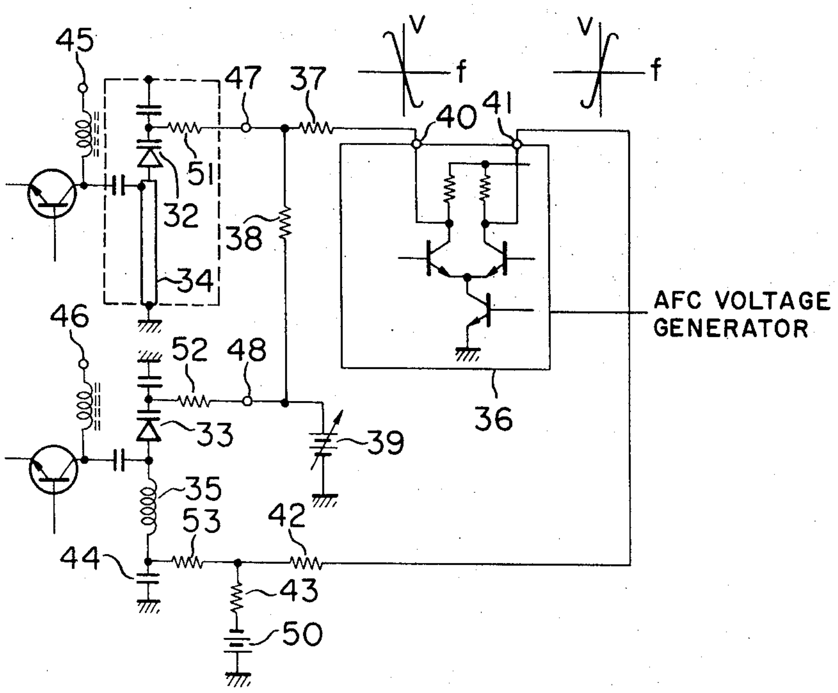
FIG. 7 is a circuit diagram of a first embodiment of an AFC device in accordance with the present invention.

Referring to FIG. 7, the automatic frequency control device in accordance with the present invention generally comprises a varactor 32 in a UHF tank circuit, a varactor 33 in a VHF tank circuit, a resonate line 34 in the UHF tank circuit, a resonate coil 35 in the VHF tank circuit, an AFC voltage generator 36 comprising for example an integrated circuit in which an output circuit is a differential amplifier; resistors 37 and 38 for dividing the AFC voltage in case of the UHF channel reception; a power source 39 for applying the channel selection voltage to the variable capacitor diode; 40; an AFC voltage output terminal for UHF channel selection; an AFC voltage output terminal for VHF channel selection; resistors 42 and 43 for dividing AFC voltage in case of VHF channel reception; a capacitor 44 for grounding in a radiofrequency manner the junction between the varactor 33 and the resonant coil 35, a power source 45 for a VHF local oscillator; and a power source 46 for UHF local oscillator.

The rate of the frequency change in response to voltage applied across a varactor used as a tuning element is considerably higher than that in response to the voltage applied across a variable capacitor used in an AFC of a turret tuner or variable capacitor tuner. Furthermore the rate of frequency change in case of the UHF channel reception is remarkably higher than in case of the VHF channel reception. Therefore, the ratio between the resistors 37 and 38 may be made greater enough so that the voltage drop in the power source 39 may be negligible, but the ratio between resistors 42 and 43 which are used to divide the AFC voltage into suitable values cannot be made as high as the ratio between the resistors 37 and 38. The AFC voltages with opposite polarities are derived from the terminals 40 and 41, the polarities of the varactors to which are applied the AFC voltages must be reversed. For this purpose, the capacitor 44 is inserted between the junction of the resonant coil 35 and the resistor 53 and the earth.

Figure 8:
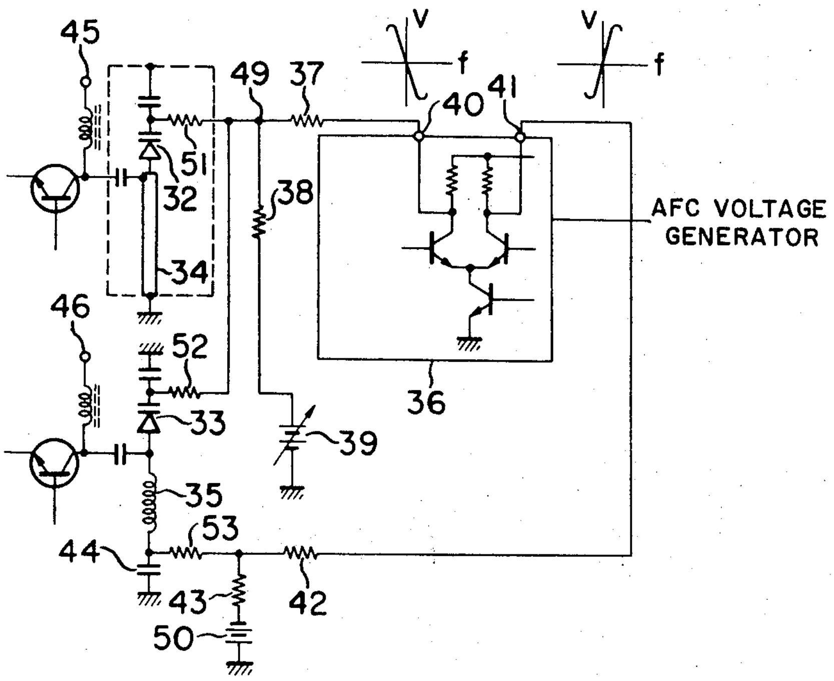
FIG. 8 is a circuit diagram of a second embodiment of the present invention.

Nest Next to FIG. 8 the second embodiment of the present invention will be described. The circuit shown in FIG. 8 is substantially similar to that shown in FIG. 7 except the cathode of the varactor 33 is directly connected to the junction between the resistors 37 and 38. The ratio between the resistors 37 and 38 is sufficiently larger than that between the resistors 42 and 43, and the AFC voltages derived from the terminals 40 and 41 and divided are applied to the varactor 33. Therefore whereas the first embodiment shown in FIG. 7 has two tuning voltage input terminals 47 and 48, the second embodiment has only one input terminal 49.

In FIGS. 7 and 8 reference numerals 51, 52 and 53 denote resistors and 50, a power source for making the AFC bias voltage in the VHF tuner negative when one end of the resonant coil 35 in the VHF tuner is grounded at r.f. frequencies and the voltage-tuning frequency in the VHF tuner is adjusted so that the tracking between a radio-frequency amplifier-tuner circuit and the local oscillator tank circuit may be attained.

In the first embodiment shown in FIG. 7, the tuning voltage superposed upon the AFC voltage is applied to one end of the varactor in the UHF tuner whereas the tuning voltage is applied to one end of the varactor in the VHF tuner and the AFC voltage to the other end thereof so that the ratio between the resistors 37 and 38 for applying the tuning voltage from the power source 39 may be sufficiently made large. The ratio between the resistors 42 and 43 for dividing the AFC voltage applied to the VHF tuner may be selected independently of the ratio between the resistors 37 and 38 so that the difference between $f_A$ and $f_A''$ described with reference to FIGS. 5 and 6 may be sufficiently increased, that is the feedback factor $\beta$ may be decreased to a desired level. It should be noted that the above functions may be attained without using any switching means. Furthermore the fact that the earth terminal of the resonant line 34 in the UHF tuner floats in a DC manner but is grounded in a radio-frequency manner is not as simple as the resonant coil 35 in the VHF tuner so that the circuit becomes complex and the efficiency is deteriorated. The resonant line 34 in FIGS. 7 and 8 may be $\lambda/4$ or $\lambda/2$ resonant line. The arrangement in accordance with the present invention that the tuning voltage is applied to one termianl of the varactor whereas the AFC voltage is applied to the other terminal is especially advantageous.

In the second embodiment shown in FIG. 8, the AFC voltage for the UHF tuner is divided, superposed upon the tuning voltage in the VHF tuner and is applied to the varactor 33 in the VHF tuner because the ratio between resistors 37 and 38 is sufficiently large so that the AFC voltage for the UHF tuner may be made negligible as compared with the AFC voltage for the VHF tuner derived from the terminal 41 and divided by the resistors 42 and 43. Therefore whereas in the first embodiment shown in FIG. 7 there must be provided two tuning voltage input terminals for VHF and UHF tuners, the second embodiment shown in FIG. 8 may use a common tuning voltage input terminal so that the circuit is simpler in construction and less expensive to manufacture.

What is claimed is:

1. An automatic frequency control device comprising:

a UHF tuner having a varactor as a tuning element;

a VHF tuner having a varactor as a tuning element;

AFC generator means for producing first and second AFC voltages of opposite polarity with respect to a reference polarity;

a source of a d.c. channel selection voltage that is variable with respect to said reference polarity;

means applying said channel selection voltage and said first AFC voltage to one terminal of said varactor of said UHF tuner;

means applying said channel selection voltage to the terminal of said varactor of said VHF tuner of the same polarity as said one terminal of the varactor of said UHF tuner; and means applying said second AFC voltage to the other terminal of said varactor of said VHF tuner.

2. The automatic frequency control device of claim 1 wherein said means applying said channel selection voltage to said one terminal of the varactor of said first VHF tuner comprises a resistor connected to said one terminal of the varactor of said UHF tuner.

3. The automatic frequency control device of claim 1 wherein the superposed channel selection voltage and first AFC voltage are applied simultaneously to said one terminal of the varactor of said VHF tuner.

4. The automatic frequency control device of claim 1 wherein said UHF tuner comprises a resonant line connected to provide a d.c. connection between said reference potential and the other terminal of the varactor of said UHF tuner.

5. The automatic frequency control device of claim 1 wherein said VHF tuner comprises a resonant coil having one end connected to the other end of the varactor of said VHF tuner, and a capacitor connected between the other end of said coil and said reference potential, said means applying said second AFC voltage to said varactor of said VHF tuner comprising means applying said second AFC voltage to the junction of said capacitor and said coil.

* * * * *